(12) United States Patent
Borthwick

(10) Patent No.: US 10,690,715 B2
(45) Date of Patent: Jun. 23, 2020

(54) SIGNAL DISTRIBUTION APPARATUS

(71) Applicant: QualiTau, Inc., Mountain View, CA (US)

(72) Inventor: James Borthwick, Santa Clara, CA (US)

(73) Assignee: QualiTau, Inc., Mountain View, CA (US)

(*) Notice: Subject to any disclaimer, the term of this patent is extended or adjusted under 35 U.S.C. 154(b) by 0 days.

(21) Appl. No.: 15/969,088

(22) Filed: May 2, 2018

(65) Prior Publication Data

US 2018/0321300 A1 Nov. 8, 2018

Related U.S. Application Data

(60) Provisional application No. 62/500,659, filed on May 3, 2017.

(51) Int. Cl.
| | |
|---|---|
| *G01R 31/26* | (2020.01) |
| *G01R 1/36* | (2006.01) |
| *G01R 31/28* | (2006.01) |
| *H03K 17/687* | (2006.01) |
| *H03K 17/693* | (2006.01) |
| *H03K 17/785* | (2006.01) |

(52) U.S. Cl.
CPC ........... *G01R 31/2642* (2013.01); *G01R 1/36* (2013.01); *G01R 31/2879* (2013.01); *H03K 17/687* (2013.01); *H03K 17/693* (2013.01); *H03K 17/785* (2013.01); *H03K 2217/0063* (2013.01)

(58) Field of Classification Search
CPC .. G01R 31/2642; G01R 1/36; G01R 31/2879; H03K 17/687; H03K 17/693; H03K 17/785; H03K 2217/0063

USPC ...... 324/600, 500, 762.01–762.09, 415, 416, 324/522, 713, 72, 72.5, 76.11, 76.39, 324/76.77, 98, 111, 120, 141
See application file for complete search history.

(56) References Cited

U.S. PATENT DOCUMENTS

| | | | | |
|---|---|---|---|---|
| 5,880,540 | A * | 3/1999 | Bessho | G01R 31/2849 307/131 |
| 6,329,785 | B1 | 12/2001 | Starkie et al. | |
| 6,339,236 | B1 * | 1/2002 | Tomii | H03K 17/0822 257/223 |
| 2005/0194963 | A1 | 9/2005 | Raichman et al. | |
| 2014/0125298 | A1 | 5/2014 | Lethellier | |

(Continued)

OTHER PUBLICATIONS

International Preliminary Report on Patentability dated Nov. 5, 2019 from International Application No. PCT/US2018/030625.

(Continued)

*Primary Examiner* — Melissa J Koval
*Assistant Examiner* — Trung Nguyen
(74) *Attorney, Agent, or Firm* — Beyer Law Group LLP

(57) ABSTRACT

A signal distribution apparatus for distributing a stress signal to a plurality of devices under test (DUTs) is disclosed. The distribution apparatus includes a single input that receives the stress voltage signal to be distributed, a plurality of outputs that distribute the stress voltage signal to the plurality of DUTs, and a plurality of integrated current limiter and switch circuits. Each integrated current limiter and switch circuit connects a DUT of the plurality of DUTs to the single input through one of the plurality of outputs, and includes at least one combined switching and current limiting element.

13 Claims, 3 Drawing Sheets

(56) References Cited

U.S. PATENT DOCUMENTS

2015/0108960 A1 4/2015 Stratakos et al.
2016/0161548 A1 6/2016 Mikkola et al.

OTHER PUBLICATIONS

International Search Report and Written Opinion dated Aug. 13, 2018 from International Application No. PCT/US2018/030625.

* cited by examiner

SIGNAL DISTRIBUTION APPARATUS

CROSS-REFERENCE TO RELATED APPLICATIONS

This application claims priority of U.S. Provisional Application No. 62/500,659, filed on May 3, 2017, which is hereby incorporated by reference in its entirety for all purposes.

FIELD OF INVENTION

The present invention relates generally to electrical measurement equipment, and, in particular, to a signal distribution apparatus for use in distributing a stress signal to a plurality of devices under test (DUTs).

BACKGROUND

Semiconductor reliability testing often requires applying a common voltage stress signal to a plurality of devices to gather information about failure times. In order to provide a cost effective and space efficient solution, semiconductor reliability test equipment vendors will often configure their system to have a single voltage source (e.g., a programmable power supply), which is connected to a plurality of DUTs to provide the common stress signal. FIG. 1 illustrates a simplified block diagram of a typical voltage stress system 100. In the most basic form, the plurality of DUTs 102 are all connected directly to the single voltage source 104 and stressed in parallel as shown in FIG. 1. However, this configuration is problematic when a DUT 102 fails because there is no way to disconnect it from the single voltage source 104 and current will continue to flow through the failed DUT 102, which may have failed to a very low resistance and may conduct excessive current loading the single voltage source 104 and/or overheating the failed DUT 102.

An improvement on the above configuration is shown in FIG. 2, in which the modified voltage stress system 200 includes switches 202 in series between the single voltage source 104 and plurality of DUTs 102. This allows a failed DUT 102 to be removed when that failure is detected by the system (e.g., by using an ammeter connected inline with the failed DUT) so the failed DUT 102 does not continue to overload the single power supply and does not overheat. However, this improvement is still problematic because the time between detection of the failure and switching off of the stress signal to a failed DUT may be long enough to disturb the other DUTs, which have not failed yet. Further, the failure event may cause a disturbance in the single voltage source 104 output due to an increase in current when a DUT fails, and this may trigger early failure in the other DUTs.

To avoid the problem described above a further modified voltage stress system 300 is shown in FIG. 3 and includes a current limiter 302 in the signal path of the voltage source 104, switch 202, and DUT 102, as shown in FIG. 3. This current limiter prevents a failed DUT 102 from overloading the voltage source 104 for the period of time between the DUT failure, its detection, and its subsequent removal from the stress signal. The current limiter 302 may simply be a fixed value resistor, or a more complex circuit using active devices to present a non-linear impedance, which is activated (limits) at a specific current level.

The type of configuration presented above is described in U.S. Pat. No. 5,880,540 to Bessho et al., entitled "SWITCHING APPARATUS WITH CURRENT LIMITING CIRCUIT." However, this configuration is still problematic for a number of reasons. First, the addition of a current limiter circuit and switch adds significant size and cost requirements to the solution. Additionally, the voltage at the DUT is often unknown due to voltage drop across the inline current limiter, and finally, removal of the DUT from the stress signal using a switch 102 may cause transient signals (or "glitches") to be presented to the remaining DUTs due to the sudden removal of current flow to the failed DUT.

SUMMARY

In accordance with an embodiment, a signal distribution apparatus for distributing a stress signal to a plurality of devices under test (DUTs) is disclosed. The distribution apparatus includes a single input that receives the stress voltage signal to be distributed, a plurality of outputs that distribute the stress voltage signal to the plurality of DUTs, and a plurality of integrated current limiter and switch circuits. Each integrated current limiter and switch circuit connects a DUT of the plurality of DUTs to the single input through one of the plurality of outputs, and includes at least one combined switching and current limiting element.

In accordance with another embodiment, a method for distributing a stress voltage signal to a plurality of devices under test (DUTs) is disclosed. The stress voltage signal to be distributed is received at a single input, and is distributed to the plurality of DUTs through a plurality of outputs. A DUT of the plurality of DUTs is connected to the single input, through an output of the plurality of outputs, and through an integrated current limiter and switch circuit of a plurality of integrated current limiter and switch circuits, each integrated current limiter and switch circuit includes at least one combined switching and current limiting element.

DETAILED DESCRIPTION

The present invention relates generally to electrical measurement equipment. The embodiments herein describe signal distribution circuitry for use in distributing a stress signal, received at a single input, to a plurality of devices under test, through a plurality of outputs.

Figure 4:
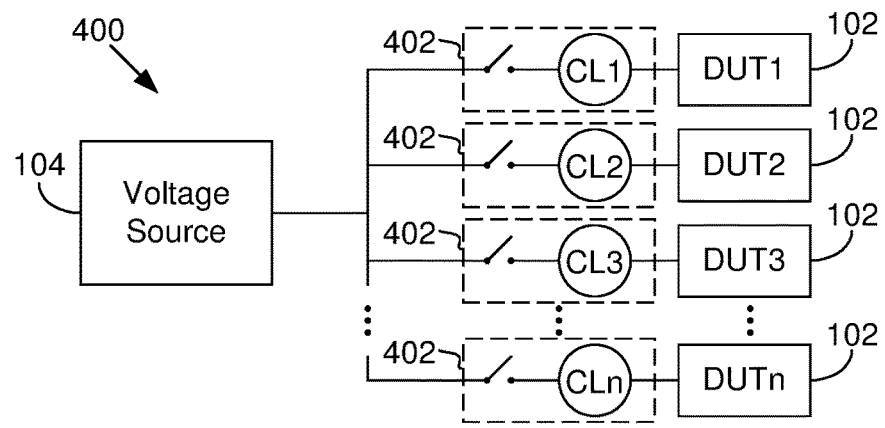
FIG. 4 illustrates a signal distribution apparatus for distributing a stress signal to a plurality of DUTs with switching and current limiting capabilities combined in an integrated current limiter and switch circuit.

FIG. 4 is a simplified block diagram illustrating an improved voltage stress reliability system 400 including an embodiment in which each current limiter and switch 402, connecting each DUT 102 to the single voltage source 104, is integrated into a combined circuit, hereinafter referred to as integrated current limiter and switch circuitry, sharing elements to provide the current limiting and switching functionality. This configuration provides a number of advantages over prior art. For example, this configuration can save significant physical space in the system by using components for multiple functions (e.g., requiring a smaller printed circuit board). A common method would be to use a transistor (or transistors) to provide both the current limiting and switching functionality. Further detail about this circuitry is described in following sections.

Another advantage of this configuration is the cost savings provided by using components for multiple functions. Providing a switch and current limiter as separate circuits would typically require twice as many components so this configuration can significantly decrease cost. Finally, this configuration can provide other advantages, such as suppression of transient signals, in various embodiments that are explained further in following paragraphs.

Figure 5:
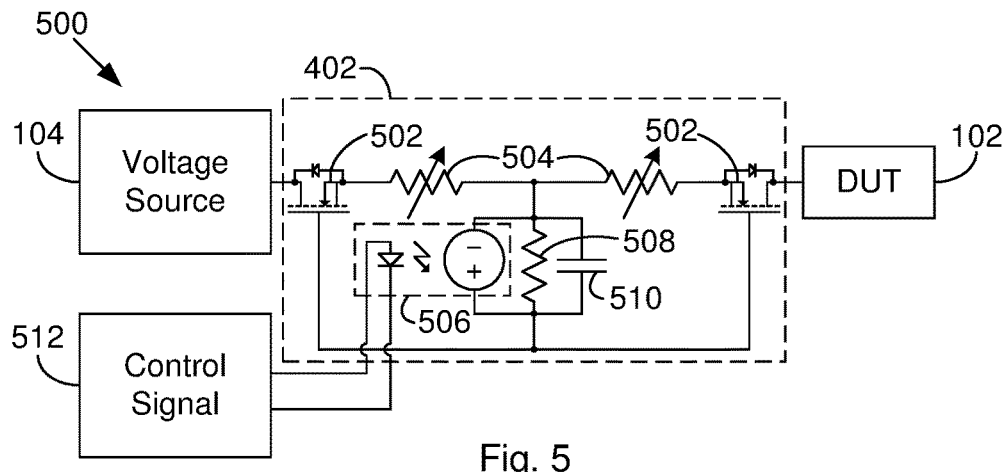
FIG. 5 is a simplified schematic of an individual integrated current limiter and switch circuit connecting a DUT to a voltage stress source.

FIG. 5 is a simplified circuit diagram illustrating a portion of a voltage stress reliability system 500 that shows an embodiment of the integrated current limiter and switch circuitry 402 introduced above. In this diagram, a pair of transistors 502 provides the current limiting and switching functionality. In the embodiment shown in FIG. 5, the pair of transistors 502 are Metal Oxide Semiconductor Field Effect Transistors (MOSFET) transistors, but other embodiments could include other types of transistors including but not limited to Bipolar Junction Transistors (BJT) or Junction Field Effect Transistors (JFET). The pair of transistors 502 is connected in such a manner as to provide bidirectional current limiting and switching, and in some embodiments the circuit is simplified to include only one transistor if only one direction of current flow (i.e., unidirectional current limiting and switching) is necessary.

The pair of transistors 502 provides the current limiting and switching functionality in conjunction with the use of a biasing circuit. In the embodiment shown, a Photovoltaic Isolator (PVI) 506 provides a biasing voltage to the transistors 502 to switch them to an on or off state. Typically, a ground level referenced (e.g., 1.8V, 3.3V, or 5V logic level) control signal 512 will be connected to the input of the PVI 506 and the activation of the control signal 512 will result in an isolated voltage being generated on the PVI output. An isolated voltage is necessary because the voltage stress signal being switched and/or current limited may be a high voltage signal (e.g., from −1000V to +1000V) and cannot be directly controlled through a low level logic signal.

The output of the PVI 506 is connected to the pair of transistors 502 such that the transistors 502 will conduct current (switch on) through their controlled channels (e.g., drain-source of a MOSFET) when the PVI 506 is enabled through the control signal 512, and will not conduct significant current (switch off) when the PVI 506 is disabled through the control signal. Furthermore, the PVI output provides a low impedance in its disabled state, which dissipates any charge that might otherwise be trapped on the gate-source terminals of the MOSFET transistor and leave it in an undefined state. In this way, the transistors 502 combined with the PVI 506 provide the required switching functionality.

The current limiting functionality of the embodiment shown in FIG. 5 is provided by the pair of transistors 502, which also provide the switching functionality, in conjunction with series current limiting resistors 504 connected between the biasing terminals of the pair of transistors 502 (in the shown embodiment, the gate and source terminals). The current limiting functionality works in the case that the pair of transistors 502 is switched on (in the case the transistors are switched off there is no current flowing so limiting is not applicable), and uses voltage developed across the series current limiting resistors 504 to counteract the bias of the PVI 506. Each transistor has a threshold voltage above which the transistor conducts significant current, and below which the transistor does not conduct significant current. In practice, this is not a discrete level below which the current completely stops flowing, but the linear current/voltage characteristic of the resistor combined with the exponential current/voltage characteristic of the transistors result in a small range in which each transistor conducts significant current (not current limiting), and then transitions to practically no additional current flowing (current limiting). Therefore, by including series current limiting resistors 504 in the integrated current limiter and switch circuitry, the current limiting functionality can be provided by the same transistors that also provide the switching functionality.

Each transistor potentially has a different threshold voltage due to manufacturing variances, and therefore a different current limiting level for a given current limiting resistor value. In some embodiments, variable resistors are used for the current limiting resistors 504 if it is desirable that the current limit be easily adjustable (e.g., to be set to practically the same current limiting level of other current limit circuits in a system). In some embodiments, the variable resistor is a mechanical potentiometer with an adjustment that allows a user to tune the current limiter to a desirable level. In other embodiments, the variable resistor is a digital potentiometer that allows programming through a digital interface to a computer, microcontroller, or some other digital circuit with programming capability. In some embodiments the programming may be permanent (e.g., set during initial assembly), semi-permanent (e.g., adjustable in the field through a specified procedure), or temporary (e.g., software running on the programming digital circuit may dynamically change the current limiting level depending on testing requirements).

Figure 6:
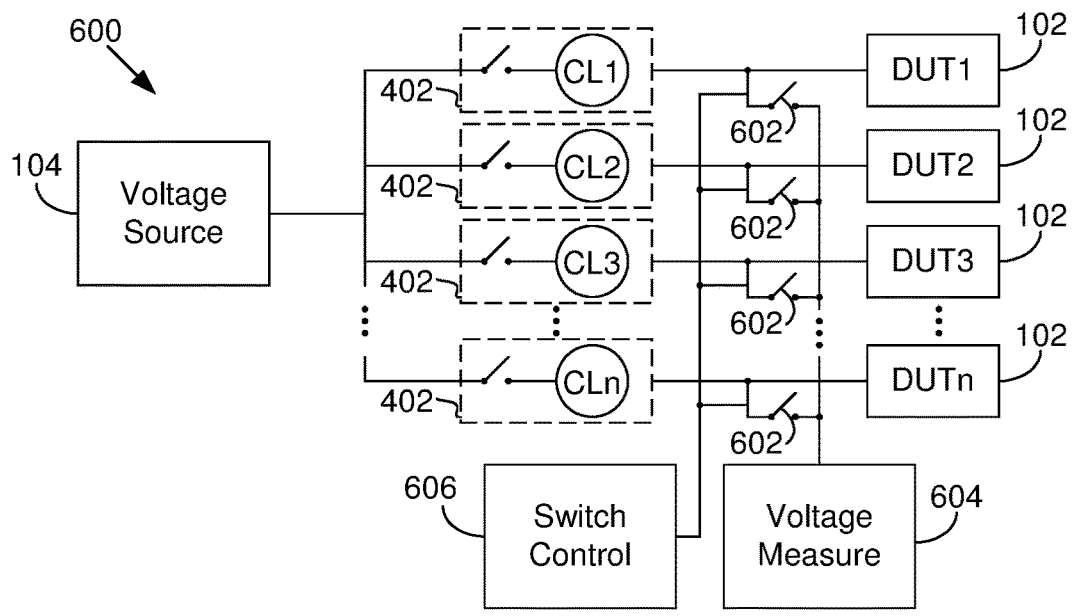
FIG. 6 illustrates a signal distribution apparatus for distributing a stress signal to a plurality of DUTs with ability to measure DUT voltage without voltage drop across the integrated current limiter and switch affecting the measurement.

FIG. 6 is a simplified block diagram illustrating an improved voltage stress reliability system 600 including an embodiment in which additional functionality of voltage measurement of each DUT is included. This voltage measurement functionality is implemented through a network of voltage measurement switches 602, connected in series with each integrated current limiting and switching circuit 402, a switch control circuit 606, and a voltage measurement circuit 604. Each voltage measurement switch 602 is switched individually so that the voltage of each DUT 102 can be measured independently of the other DUT voltages. The switch control circuit 606 performs the function of enabling or disabling each voltage measurement switch 602 so that the voltage of each DUT 102 can be measured with the voltage measurement circuit 604. In some embodiments, this switching functionality is provided by an integrated multiplexer circuit or instrument, and in other embodiments it consists of an array of individual switches (mechanical relays, reed relays, or solid-state relays) arranged to allow connection of multiple inputs to a single output.

The voltage measurement circuit 604 is a circuit that measures voltage and converts it to a digital representation. In some embodiments, the digital representation is then transferred to a host computer over a communication bus. The communication bus is typically a standard interface (e.g., Ethernet, USB, RS-422/485, RS-23, SPI, and/or I2C). In some embodiments, the voltage measurement circuit is an off-the-shelf instrument such as a digital multimeter (DMM) with all required circuitry integrated into a housing. In other embodiments, the voltage measurement circuit is an arrangement of discrete components configured to provide the necessary voltage measurement functionality. For example, in some embodiments, the voltage measurement circuit includes an analog to digital converter (ADC), an auto-ranging circuit, and communication interface circuitry.

The addition of the voltage measurement functionality provides capability to measure voltage and potentially correct for voltage error at each DUT 102. In an ideal case, the integrated current limit and switch circuitry 402 would have no voltage drop (or burden) during normal operating conditions (i.e., during the portion of the test in which a DUT has not failed). However, in some cases, the voltage drop across the integrated current limit and switch circuitry 402 may be significant even when the current limiting function has not engaged. For example, if a DUT 102 is drawing 1 mA (pre-failure current) and the effective resistance of the integrated current limit and switch circuitry 402 is 10 ohms, a burden voltage of 10 mV would be present across the integrated current limit and switch circuitry 402. Depending on the stress voltage condition this could represent a significant amount of error (e.g., 1% or more). It is therefore desirable to be able to know the DUT voltage through use of additional voltage measurement switching circuitry as shown in FIG. 6.

The voltage measurement of the DUT 102 after the integrated current limit and switch circuitry 402 can be used for multiple purposes. For example, the DUT voltage measurement may be used to compensate (or partially compensate) for the voltage drop across the integrated current limit and switch circuitry 402. This could be done by measuring all the DUT voltages during a test and setting the voltage supply 104 to a level that compensates for the average of all the drops across the integrated current limit and switch circuitry 402. For example, if three DUTs are connected during a test and they have individual voltage errors of 9 mV, 10 mV, and 11 mV from the output of the voltage supply (e.g., due to voltage drop across the integrated current limit and switch), the voltage supply could be increased by 10 mV (the average of the voltage error) to compensate for the majority of the voltage error (i.e., in this example the voltage error would be reduced from a maximum of 11 mV to 1 mV).

Another use of the voltage measurement functionality is to detect whether a DUT 102 has failed or not. Typically during a test the current of the DUT 102 will be measured periodically, either by measuring current through another node of the DUT, or by connecting a current measurement circuit (e.g., ammeter) in series with the integrated current limit and switch circuitry 402. This current measurement data is used to assess the status of the DUT. However, making a current measurement on the DUT 102 is a complicated process since it typically requires temporarily inserting a current measurement circuit in series with the DUT, and care must be taken to not introduce transient signals or otherwise disrupt the stress condition applied to the DUT. Additionally, current measurement often requires switching a number of current ranges to detect the device current, which takes significant time. The addition of voltage measurement functionality as shown in FIG. 6 allows a fast and relatively simple method of detecting device failure since in certain tests device failure is typically accompanied by an increase of current that engages the current limiting functionality of the integrated current limit and switch circuitry 402. Use of the voltage measurement functionality allows the system to quickly and cleanly scan through all the DUTs 102 connected during a test and detect if any have activated their associated current limiting circuit. For DUTs that have triggered their associated current limiting circuit, the experiment may be configured to take a specific action (e.g., remove the DUT from further stress, perform more in-depth characterization of the failed DUT, and/or stop the experiment).

Figure 1:
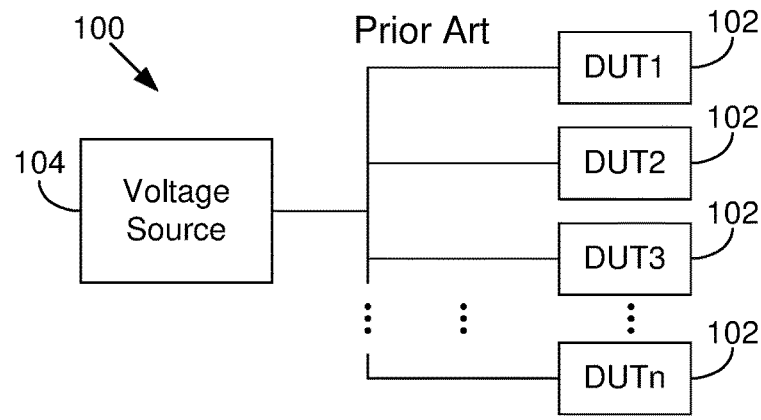
FIG. 1 illustrates a signal distribution apparatus for sharing a stress signal to a plurality of DUTs.
Figure 2:
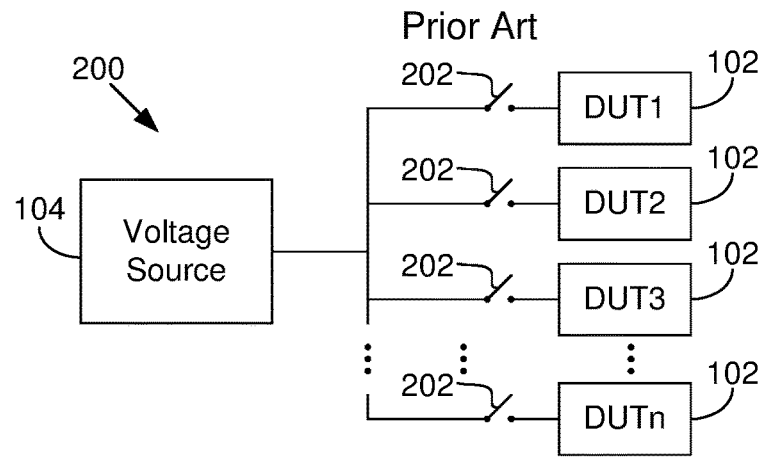
FIG. 2 illustrates a signal distribution apparatus for sharing a stress signal to a plurality of DUTs with ability to switch off the shared stress signal to each DUT individually.
Figure 3:
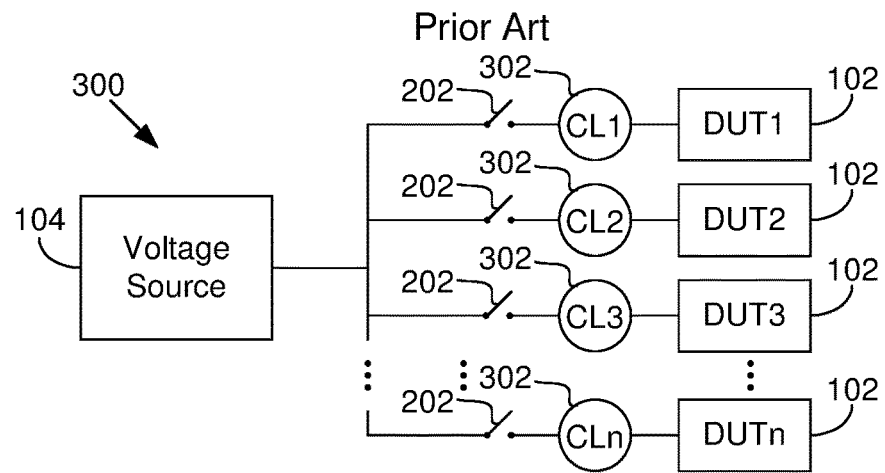
FIG. 3 illustrates a signal distribution apparatus for distributing a stress signal to a plurality of DUTs with ability to switch off the shared stress signal and limit current to each DUT individually.

For a DUT 102 that is detected to have failed, either through voltage or current measurement, the integrated current limiter and switch circuitry 402 provides an additional benefit during removal of the device from stress. A typical parallel test system as described above and shown in FIGS. 1, 2, and 3, will use mechanical or reed relays for the switches 202 used to disconnect the DUT 102 from the voltage supply. These types of relays have limitations that make "hot switching" undesirable. Hot switching is an industry term for the activation or deactivation of a relay when a voltage is present (or will be) across the terminals being connected or disconnected.

For a mechanical or reed relay, hot switching is problematic for semiconductor reliability testing for two reasons. First, hot switching will typically result in a transient signal being applied to the connected DUT and also others connected to the same voltage supply. This is due to the suddenness of the connecting or disconnecting (transition from short to open or open to short is almost instantaneous when relay contacts connect or disconnect) of the relay, and compounded by relay "bounce" in which the contacts of the relay connect and disconnect multiple times when transitioning from one state to another, and this will extend and exacerbate the transient signal that is caused. The transient signal is detrimental to the test because it may cause additional damage to the DUT being disconnected, and/or be applied to other DUTs that have not failed yet, possibly triggering their early failure or causing damage that changes their failure times.

Another reason hot switching is problematic is damage to the relay itself. For mechanical and/or reed relays, hot switching can cause damage to the contacts due to arcing that occurs as the contacts are physically close to each other when transitioning states. This is also exacerbated by the relay bounce described above and may result in changing or higher contact resistance, contact sticking, and ultimately to failure of the relay. Typically, a relay vendor will specify lifetime in number of switching cycles possible, and will often derate the lifetime by, for example, two orders of magnitude for hot switching conditions versus non-hot switching.

For the above reasons, semiconductor reliability testers are often designed to avoid hot switching relays by changing the stress voltage to eliminate the voltage across the relays to be switched (e.g., setting the stress voltage supply to 0V so that a DUT connected to ground has 0V across it). However, stress voltage removal during a test is not desirable due to the interruption of stress for the DUTs that have not failed. In some cases, these DUTs will have their test failure times affected by the removal of stress due to effects like recovery or damage during re-application of stress voltage, which may degrade or invalidate the results of the experiment.

The integrated current limiter and switch circuitry 402 overcomes the above problems due to the nature of the switching elements and the arrangement of the biasing circuitry. First, use of transistors as the switching elements eliminates any problems due to arcing and/or bounce since there is no moving contact in a transistor. Second, the transition time of the switching in the integrated current limiter and switch circuitry 402 can be longer and controlled through the use of additional circuit elements. This allows the system to turn off (or on) an integrated current limiter and switch circuit 402, disconnecting (or connecting) a specific DUT 102 while the stress voltage is still applied, without a transient signal being applied to the specific DUT or other DUTs. In some embodiments, the transition time of the switching in the integrated current limiter and switch circuitry 402 is controlled through a resistor 508 and capacitor 510 (RC) network connected in the biasing circuitry as shown in FIG. 5. By adjusting the values of the resistor 508 and/or capacitor 510 in the RC network, the switching time can be lengthened or shortened to optimal length for preventing transient signals from being applied to the DUT(s).

In some embodiments, the transition time is controlled through the control signal to the input of the PVI and may include a continuously varying signal applied over a predetermined time period during the transition. For example, the output of an integrator circuit could provide the continuously varying signal to the input of the biasing PVI in response to the control signal providing a step signal to the input of the integrator circuit. In another embodiment, a discrete set of voltages is applied over a predetermined time period during the transition. For example, the output of a digital to analog converter (DAC) may be applied to the input of the biasing PVI and ramped to generate a time controlled ramp signal that results in varying switching times depending on the ramp rate. In some embodiments, the output of the DAC connected to the input of the PVI may also be used to control the current limiting level of the integrated current limit and switch circuitry 402, in conjunction with the series current limiting resistors 504.

Figure 7:
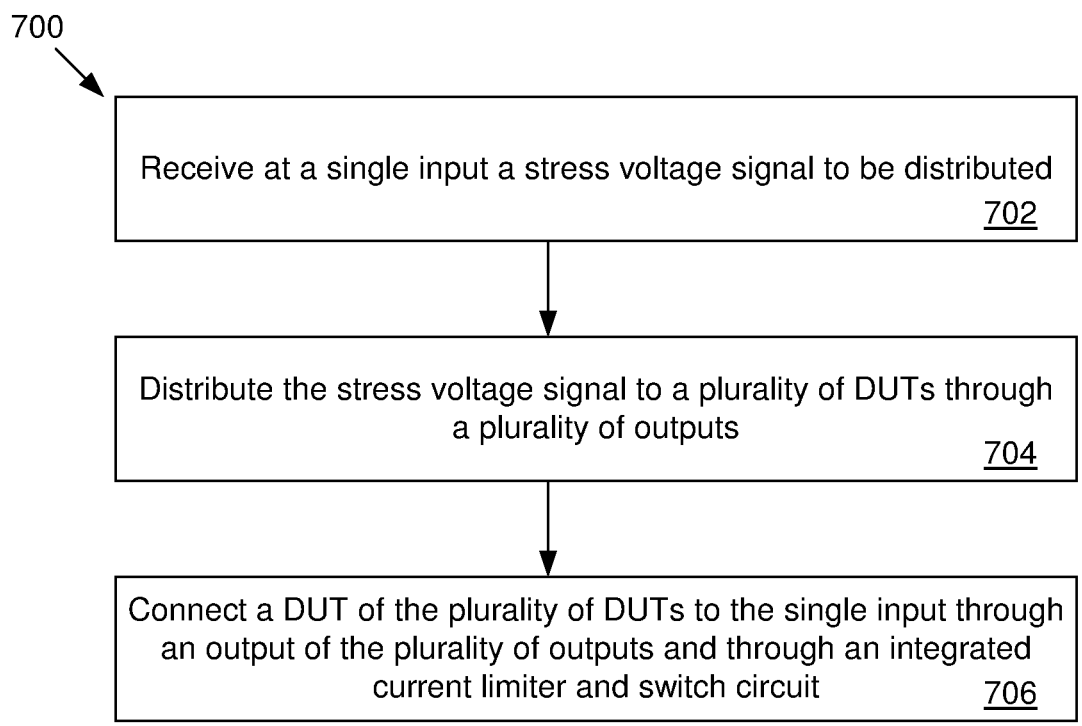
FIG. 7 is a flow chart of a method of providing a shared stress signal to a plurality of DUTs.

FIG. 7 is a flow chart of a method 700 of distributing a stress voltage signal to a plurality of DUTs. In step 702, the stress voltage signal to be distributed is received at a single input. In step 704, the stress voltage signal is distributed to a plurality of DUTs through a plurality of outputs. Finally, in step 706, a DUT of the plurality of DUTs is connected to the single input through an output of the plurality of outputs and through an integrated current limiter and switch circuit.

While only a few embodiments of the invention have been described in detail, it should be understood that many variations are possible based on the disclosure herein. Although features and elements are described above in particular combinations, each feature or element can be used alone without the other features and elements or in various combinations with or without other features and elements. In view of all of the foregoing, it should be apparent that the present embodiments are illustrative and not restrictive and the invention is not limited to the details given herein, but may be modified within the scope and equivalents of the appended claims.

What is claimed is:

1. A signal distribution apparatus for applying a stress voltage signal to a plurality of devices under test (DUTs), the distribution apparatus comprising:
    a single input that receives the stress voltage signal to be distributed; a plurality of outputs that distribute the stress voltage signal to the plurality of DUTs; and
    a plurality of integrated current limiter and switch circuits, each integrated current limiter and switch circuit connecting a DUT of the plurality of DUTs to the single input through one of the plurality of outputs, and comprising a pair of transistors for limiting and switching bipolar currents to and from the DUT, wherein the pair of transistors is connected in series with a series current limiting resistor between the pair or transistors.

2. The signal distribution apparatus of claim 1, further comprising a selectable voltage measurement circuit for measuring the voltage of each DUT, the selectable voltage measurement circuit comprising:
    a plurality of voltage measurement switches, each connected to one of the plurality of outputs;
    a switch control circuit controlling the switching of the plurality of voltage measurement switches; and
    a voltage measurement circuit connected to each of the plurality of voltage measurement switches.

3. A signal distribution apparatus for applying a stress voltage signal to a plurality of devices under test (DUTs), the distribution apparatus comprising:
    a single input that receives the stress voltage signal to be distributed; a plurality of outputs that distribute the stress voltage signal to the plurality of DUTs; and
    a plurality of integrated current limiter and switch circuits, each integrated current limiter and switch circuit connecting a DUT of the plurality of DUTs to the single input through one of the plurality of outputs, and comprising at least one combined switching and current limiting element and a biasing circuit connected to the pair of transistors, the biasing circuit comprising a photovoltaic isolator for biasing the pair of transistors to an on or off state, wherein the at least one combined switching and current limiting element is a pair of transistors for limiting and switching bipolar currents to and from the DUT.

4. The signal distribution apparatus of claim 3, further comprising a resistor and capacitor network connected to the output of the photovoltaic isolator for providing a time controlled biasing signal to the pair of transistors.

5. The signal distribution apparatus of claim 3, wherein the integrated current limiter and switch circuits each include two series resistors connected to the pair of transistors for counteracting the biasing of the pair of transistors and limiting the current flowing through the pair of transistors.

6. The signal distribution apparatus of claim 5, wherein the two series resistors are adjustable resistors for adjusting the current limiting level of the integrated current limiter and switch circuits.

7. The signal distribution apparatus of claim 6, wherein the two adjustable resistors are mechanical potentiometers.

8. The signal distribution apparatus of claim 6, wherein the two adjustable resistors are digital potentiometers.

9. A method for distributing a stress voltage signal to a plurality of devices under test (DUTs), the method comprising:
    receiving the stress voltage signal to be distributed at a single input; distributing the stress voltage signal to the plurality of DUTs through a plurality of outputs;
    connecting a DUT of the plurality of DUTs to the single input, through an output of the plurality of outputs, and through an integrated current limiter and switch circuit of a plurality of integrated current limiter and switch circuits, each integrated current limiter and switch circuit comprising a pair of transistors for limiting and switching bipolar currents to and from the DUT; and connecting the pair of transistors with a series current limiting resistor in series between the pair of transistors.

10. The method of claim 9, further comprising measuring the voltage of each DUT using a selectable voltage measurement circuit, the selectable voltage measurement circuit comprising:

a plurality of voltage measurement switches, each connected to one of the plurality of outputs;

a switch control circuit controlling the switching of the plurality of voltage measurement switches; and a voltage measurement circuit connected to each of the plurality of voltage measurement switches.

11. A method for distributing a stress voltage signal to a plurality of devices under test (DUTs), the method comprising:

receiving the stress voltage signal to be distributed at a single input; distributing the stress voltage signal to the plurality of DUTs through a plurality of outputs; and connecting a DUT of the plurality of DUTs to the single input, through an output of the plurality of outputs, and through an integrated current limiter and switch circuit of a plurality of integrated current limiter and switch circuits, each integrated current limiter and switch circuit comprising at least one combined switching and current limiting element, wherein the at least one combined switching and current limiting element is a pair of transistors for limiting and switching bipolar currents to and from the DUT; and connecting a biasing circuit to the pair of transistors, the biasing circuit comprising a photovoltaic isolator for biasing the pair of transistors to an on or off state.

12. The method of claim 11, further comprising connecting a resistor and capacitor network to the output of the photovoltaic isolator for providing a time controlled biasing signal to the pair of transistors.

13. The method of claim 11, further comprising connecting two series resistors to the pair of transistors for counteracting the biasing of the pair of transistors and limiting the current flowing through the pair of transistors.

* * * * *